(12) United States Patent
Kularatna et al.

(10) Patent No.: US 11,575,350 B2
(45) Date of Patent: Feb. 7, 2023

(54) LOW COMPLEXITY NON-LINEAR MODELLING TECHNIQUES FOR WIRELESS TECHNOLOGIES

(71) Applicant: Nokia Solutions and Networks Oy, Espoo (FI)

(72) Inventors: Shavantha Kularatna, Flower Mound, TX (US); Aki Heikki Jalmari Korhonen, Kempele (FI); Christian Reichl, Hirschau (DE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 584 days.

(21) Appl. No.: 16/499,806

(22) PCT Filed: Apr. 5, 2017

(86) PCT No.: PCT/US2017/026150
§ 371 (c)(1),
(2) Date: Sep. 30, 2019

(87) PCT Pub. No.: WO2018/186854
PCT Pub. Date: Oct. 11, 2018

(65) Prior Publication Data
US 2020/0106397 A1    Apr. 2, 2020

(51) Int. Cl.
*H03F 1/32*    (2006.01)
*H03F 3/24*    (2006.01)
*H04B 1/40*    (2015.01)

(52) U.S. Cl.
CPC ............ *H03F 1/32* (2013.01); *H03F 3/245* (2013.01); *H03F 2200/321* (2013.01); *H03F 2200/451* (2013.01); *H04B 1/40* (2013.01)

(58) Field of Classification Search
CPC ...... H03F 1/32; H03F 3/245; H03F 2200/321; H03F 2200/451; H03F 2201/3227;
(Continued)

(56) References Cited

U.S. PATENT DOCUMENTS 7,472,152 B1    12/2008  Tsui et al.
8,391,809 B1 *   3/2013  Fuller .................. H03F 1/3241
                                                  455/552.1
(Continued)

OTHER PUBLICATIONS

International Search Report and Written Opinion received for corresponding Patent Cooperation Treaty Application No. PCT/US2017/026150, dated Jun. 27, 2017, 12 pages.
(Continued)

*Primary Examiner* — Kenneth T Lam
(74) *Attorney, Agent, or Firm* — Squire Patton Boggs (US) LLP

(57) ABSTRACT

Various communication devices may benefit from the appropriate use of modeling techniques. For example, devices that include components that may be driven into non-linear ranges of operation may benefit from low complexity non-linear modelling techniques. Such devices may be used, for example, in wireless communication systems. A method can include obtaining a sample of a signal representative of power consumed by a device while the device is operating in a non-linear range while being driven according to a driving signal. The method can also include computing a correction to the driving signal based on the sample. The correction can be calculated based on a plurality of non-overlapped non-linear sections corresponding to a response of the device. The method can further include applying the correction to adjust the driving signal. The correction can be configured to adjust the power to a desired value of power.

17 Claims, 7 Drawing Sheets

(58) Field of Classification Search
CPC ...... H03F 1/3258; H03F 3/195; H03F 1/3247; H04B 1/40
See application file for complete search history.

(56) References Cited

U.S. PATENT DOCUMENTS

| | | | | |
|---|---|---|---|---|
| 9,923,595 | B2* | 3/2018 | Molina | H04L 25/03012 |
| 10,812,166 | B2* | 10/2020 | Kim | H03F 3/24 |
| 11,057,004 | B2* | 7/2021 | Kim | H03F 3/24 |
| 2005/0116775 | A1* | 6/2005 | McBeath | H03F 1/3241 |
| | | | | 330/149 |
| 2006/0158254 | A1* | 7/2006 | Johnson | H03F 1/3241 |
| | | | | 330/149 |
| 2008/0130789 | A1* | 6/2008 | Copeland | H04L 25/03343 |
| | | | | 375/297 |
| 2010/0181961 | A1* | 7/2010 | Novak | H02J 7/00034 |
| | | | | 320/108 |
| 2012/0078560 | A1 | 3/2012 | Satou et al. | |
| 2014/0314135 | A1 | 10/2014 | Duan et al. | |
| 2015/0070089 | A1* | 3/2015 | Eliaz | H03F 1/3258 |
| | | | | 330/149 |
| 2016/0034421 | A1* | 2/2016 | Magesacher | G06F 17/11 |
| | | | | 703/2 |
| 2016/0308577 | A1* | 10/2016 | Molina | H04L 5/1461 |
| 2018/0375480 | A1* | 12/2018 | Rollins | H03F 1/3252 |

OTHER PUBLICATIONS

Extended European Search Report received for corresponding European Patent Application No. 17904971.3, dated Oct. 6, 2020, 10 pages.

Safari et al., "Spline-Based Model for Digital Predistortion of Wide-Band Signals for High Power Amplifier Linearization", IEEE/MTT-S International Microwave Symposium, Jun. 3-8, 2007, pp. 1441-1444.

Zhu, "Decomposed Vector Rotation-Based Behavioral Modeling for Digital Predistortion of RF Power Amplifiers", IEEE Transactions on Microwave Theory and Techniques, vol. 63, No. 2, Feb. 2015, pp. 737-744.

European Communication pursuant to Article 94(3) EPC, corresponding to EP Application No. 17 904 971.3, dated Jun. 13, 2022.

* cited by examiner

Table 1

| Vectoral Sections | Vector | abs(Vector)^2 | equal power threshold |
|---|---|---|---|
| Vector Sum x(n) | 0.57197+0.448648i | 0.528 | |
| Section 1 x1(n) | 0.57197+0.448648i | 0.0625 | 0 |
| Section 2 x2(n) | 0.57197+0.448648i | 0.188 | 0.0625 |
| Section 3 x3(n) | 0.57197+0.448648i | 0.278 | 0.25 |
| Section 4 x4(n) | 0 | 0 | 0.562 |

Figure 3

Table 2

| Vectoral Sections | Vector | abs(Vector)^2 | equal power threshold |
|---|---|---|---|
| Vector Sum x(n) | 0.57197+0.448648i | 0.528 | |
| Section 1 x1(n) | 0.57197+0.448648i | 0.528 | 0 |
| Section 2 x2(n) | 0.57197+0.448648i | 0.528 | 0.0625 |
| Section 3 x3(n) | 0.57197+0.448648i | 0.528 | 0.25 |
| Section 4 x4(n) | 0 | 0 | 0.562 |

Figure 4

LOW COMPLEXITY NON-LINEAR MODELLING TECHNIQUES FOR WIRELESS TECHNOLOGIES

RELATED APPLICATION

This application was originally filed as Patent Cooperation Treaty Application No. PCT/US2017/026150 filed Apr. 5, 2017.

BACKGROUND

Field

Various communication devices may benefit from the appropriate use of modeling techniques. For example, devices that include components that may be driven into non-linear ranges of operation may benefit from low complexity non-linear modelling techniques. Such devices may be used, for example, in wireless communication systems.

Description of the Related Art

Component vendors and manufacturers are pushing their devices and products to be driven hard or operated with maximized usage. However, maximising the usage to save power can cause the devices to operate in non-linear regions. When devices operate at non-linear regions, they may fail specifications stipulated by regulatory agencies. Hence, some form of correction may be required for the compressing or non-linear effect of the device. Non-linear modelling methods, therefore, are an area of study that may benefit need of energy efficiency.

Non-linear modelling can be used to estimate the non-linearity, so that the non-linearity can be cancelled. This cancellation of the non-linear effect can be used to meet regulatory specifications with maximum power usage, thereby operating the devices and/or products with maximum efficiency.

Generalized memory polynomials are commonly used to model non-linear devices. Non-linear modelling involves linear and multiple non-linear parts expressed in terms of the input signal x(n). The input signal is often shifted by q (i.e. x(n−q)) to represent memory of the nonlinear devices. Eq1 below describes this form where the non-linear device output y(n) is expressed with linear and nonlinear terms.

$$y(n) = \sum_{k=0}^{K-1} a_k x(n-q)|x(n-q)|^{2k} \qquad \text{eq1}$$

Linear terms are expressed when k=0. Nonlinear terms are expressed when k is not equal to zero. For example, the $5^{th}$ order terms with memory can be expressed as: $x(n-q)|x(n-q)|^4$ Equations that model the non-linear devices are designed to match the non-linearity of the devices under consideration. As an example, it is common for power amplifiers to show high non-linearities such as $21^{st}$ or $24^{th}$ order. Hence, the non-linear model is designed to match with the highest non-linear order exhibited by the power amplifier in order to obtain cancellation of that effect.

Thus, when non-linear devices are driven hard into compression they can exhibit very high order non-linearities, for example, an order greater than 21. However, to express such large non-linerites, equation 1 (eq1) needs to compute terms such as:

$$a_k x(n-q)|x(n-q)|^{20}$$

The above term requires exactly 12 multipliers times q to compute. This may be a high cost for a product with limited capabilities. With future wireless technologies that require, multiple input and multiple output (MIMO) and additional radio channels for beam forming may make the total cost even higher.

In addition to the cost, there is a mathematical limitation. With 10 multiplication of $|x(n-q)|^2$ to obtain $|x(n-q)|^{20}$, a small error in $|x(n-q)|^2$ will translate into a large error in the final product. Moreover, whenever these terms are included in Matrix operations (auto-correlation matrix, for example), they may complicate matrix inversions. Sometimes, inversion may not even be possible due to ill-conditioned matrices.

SUMMARY

According to certain embodiments, a method can include obtaining a sample of a signal representative of power consumed by a device while the device is operating in a non-linear range while being driven according to a driving signal. The method can also include computing a correction to the driving signal based on the sample. The correction can be calculated based on a plurality of non-overlapped non-linear sections corresponding to a response of the device. The method can further include applying the correction to adjust the driving signal. The correction can be configured to adjust the power to a desired value of power.

In certain embodiments, an apparatus can include at least one processor and at least one memory including computer program code. The at least one memory and the computer program code can be configured to, with the at least one processor, cause the apparatus at least to obtain a sample of a signal representative of power consumed by a device while the device is operating in a non-linear range while being driven according to a driving signal. The at least one memory and the computer program code can also be configured to, with the at least one processor, cause the apparatus at least to compute a correction to the driving signal based on the sample. The correction can be calculated based on a plurality of non-overlapped non-linear sections corresponding to a response of the device. The at least one memory and the computer program code can further be configured to, with the at least one processor, cause the apparatus at least to apply the correction to adjust the driving signal. The correction can be configured to adjust the power to a desired value of power.

An apparatus, according to certain embodiments, can include means for obtaining a sample of a signal representative of power consumed by a device while the device is operating in a non-linear range while being driven according to a driving signal. The apparatus can also include means for computing a correction to the driving signal based on the sample. The correction can be calculated based on a plurality of non-overlapped non-linear sections corresponding to a response of the device. The apparatus can further include means for applying the correction to adjust the driving signal. The correction can be configured to adjust the power to a desired value of power.

An apparatus, in certain embodiments, can include a sampling circuit configured to sample a signal representative of power consumed by a device while the device is operating in a non-linear range while being driven according to a driving signal. The apparatus can also include a computation circuit configured to compute a correction to the driving signal based on the sample. The correction can be calculated based on a plurality of non-overlapped non-linear sections corresponding to a response of the device. The sampling circuit and the computation circuit can be provided in feedback circuitry. The feedback circuitry can be further configured to apply the correction to adjust the driving signal. The correction can be configured to adjust the power to a desired value of power.

BRIEF DESCRIPTION OF THE DRAWINGS

For proper understanding of the invention, reference should be made to the accompanying drawings, wherein:

FIG. 3 illustrates Table 1, showing vectorial sections according to certain embodiments.

FIG. 4 illustrates Table 2, showing vectorial sections according to certain embodiments.

DETAILED DESCRIPTION

The above-described issues may limit solutions to an area where the power amplifier (PA) response is split into multiple sections, also known as splines, so that the model order can be reduced.

There are multiple forms of spline implementations, which use third order sections with memory terms per each section of the non-linear model. Third order based splines can be used to avoid the issues identified above. A third order section with memory can be described as follows:

$$\sum_{p=0}^{M}\sum_{q=0}^{N} b_k \ x1(n-p)|x1(n-q)|^2 \qquad eq2$$

where p and q are memory terms of the $k^{th}$ non-linear section. Linear terms are omitted for this discussion.

Figure 1:
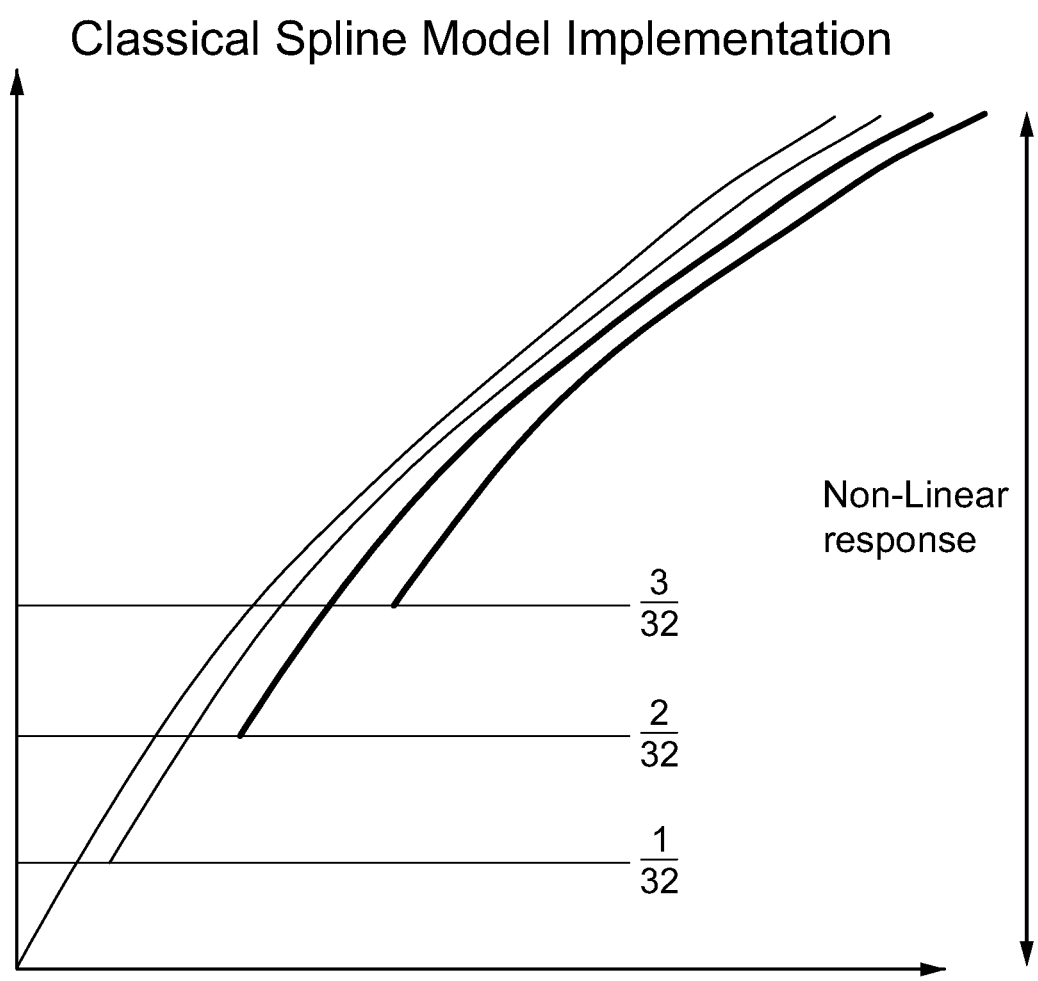
FIG. 1 illustrates a classical spline model implementation.

FIG. 1 illustrates a classical spline model implementation, which can be used to model non-linear devices. Different lines indicate non-linear sections (splines). The non-linear response spans the back arrows shown in FIG. 1. This is a specific case where each section is offset by $\frac{1}{32}$. However, in general this offset can be 1/N where N is the number of sections used in the complete model. Each of the sections can be modelled with third order products with memory, as shown above in eq2.

While the performance of the spline model illustrated in FIG. 1 is good, it still involves a large amount of splines that are overlapped with each other. This redundancy does not add to any extra modelling accuracy improvement. However, the number of multipliers increase as a result of the overlap.

Figure 2:
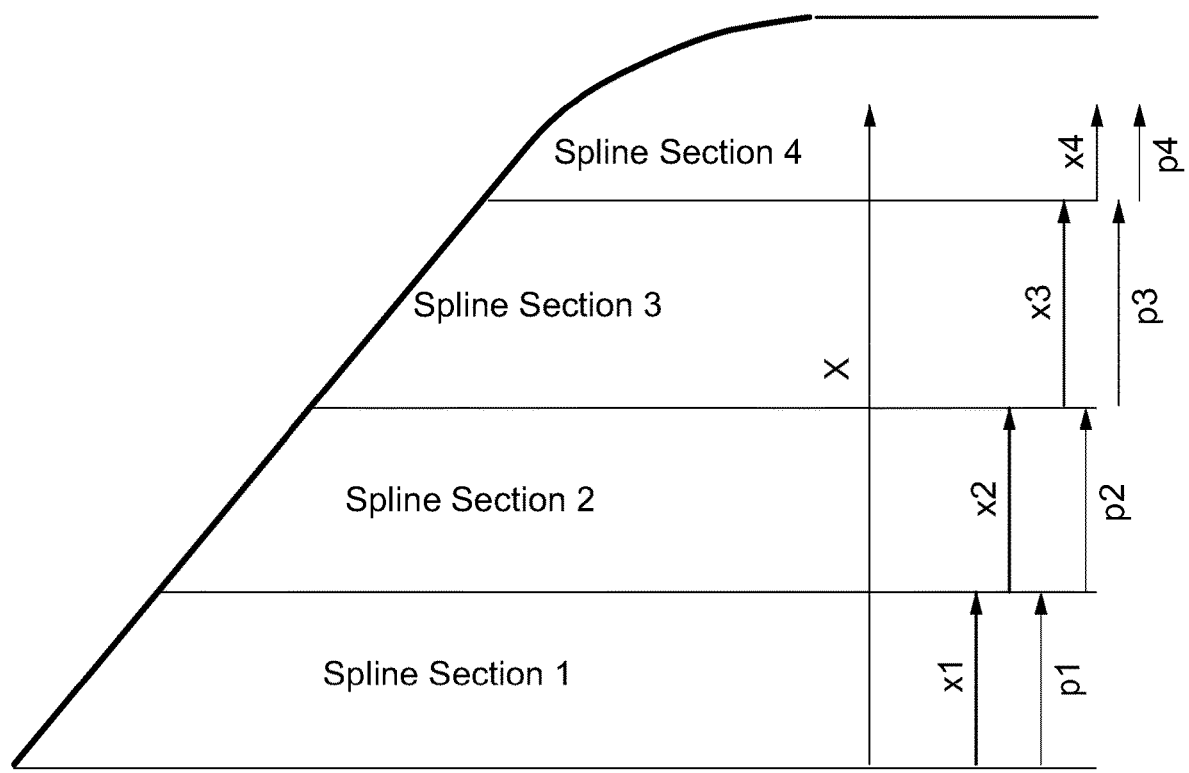
FIG. 2 illustrates the theoretical vectorial method.

Another method is a theoretical vectorial method. This method does not overlap the splines as in the classical spline modelling method. FIG. 2 illustrates the theoretical vectorial method. This approach is also illustrated via equations 3 and 4.

The theoretical vectorial method does not inherit the numerical issues mentioned above. It belongs to the category of splines where linear and non-linear elements do not describe the whole PA, (or other non-linear device) but rather a small section of it. This avoids the use of high order non-linear products, thereby avoiding the numerical issues mentioned above.

The theoretical vectorial model only uses 4 sections where each section is described with linear and non-linear products. The highest non-linear product used per section does not exceed the $3^{rd}$ order.

Eq3 and eq4 describe the mathematical basis for the theoretical vectorial method. The theoretical vectorial method performs well in an academic setting or for a case where radio or other products have sufficient processing to compute either a square root or an arctan. Square root or an arctan is used to split the signal X(n) into x1(n), x2(n), . . . , x4(n), as described by eq4, below. This is not easy to perform in hardware, as specific look up tables have to be allocated to aid computation. The values p1, p2, p3 and p4 are the associated power of each signal x1(n), x2(n), x3(n) and x(4), see eq3 for . . . $|x1(n-q_{k1})|^2$.

$$y(n) = \sum_{k=0}^{L} a_k x1(n-k) + \sum_{k1=0}^{M} b_k x(n-p_{k1})|x1(n-q_{k1})|^2 \ldots + \qquad eq3$$

$$\sum_{k=0}^{L} c_k x4(n-k) + \sum_{k1=0}^{M} d_k x4(n-p_{k1})|x4(n-q_{k1})|^2$$

$$X(n) = x1(n) + x2(n) + x3(n) + x4(n) \qquad eq4$$

Accordingly, certain embodiments may be provided to address these and other issues. For example, according to a first embodiment (first for labelling purposes only, and not by way of limitation), the computation of either square root or arctan can be avoided. The first embodiment can rely on a simple computation of the square of x(n) as shown in eq5 below:

$$sq = \text{real}(x(n))^2 + \text{imaginary}(x(n))^2 \qquad eq5$$

The first embodiment avoids the square root calculation at least because this embodiment does not rely on a vectorial split of the signal. However, the corresponding power split can be maintained.

FIG. 3 illustrates Table 1, showing vectorial sections according to certain embodiments. The table includes five rows of data, the first row being a summation of the various sections, and the remaining rows being the individual sections. The corresponding vector, the square of the absolute value of the vector, and an equal power threshold are shown for each vectorial section. In this case, the vector x(n) is duplicated in all sections without any split as long as the corresponding section contains power.

In this example, power threshold regions are defined as [0 0.0625 0.25 0.562]. The corresponding sample power is 0.528. Because this power is less than the threshold for the largest power (namely 0.562), section 4 power is zero. Since section 4 has no power, the corresponding vector x4 is zero as well. The threshold for section 3 is 0.25. Because the power subtraction (0.528−0.25)=0.278, that is the corresponding power of section 3. The remaining power is equal to 0.25. Hence, the section 2 power is calculated as follows (0.25−0.0625)=0.1875. The remaining section 1 power is 0.0625. A notable advantage is that power need not be calculated for every section. For example, except for section 3 in the example, section 2 and section 1 power need not be computed. Rather precomputed threshold differences can be used.

Since sections 1, 2, and 3 contain power, the corresponding vectors (column 3 denoted as "Vector") are duplicated by the sample value x(n)=0.57197+j*0.448648, where j (in this equation) and i (in FIG. 3) refer to the square root of negative one.

This then avoids the use of the square root or the arctan. However, the power split is still maintained as per the example. As power is not a vector, a flexible unequal power distribution can also be adopted without additional computation complexity.

An equation for the first embodiment is illustrated by eq6:

$$y(n) = \sum_{k=0}^{L} a_k x(n-k) + \sum_{k1=0}^{M} b_k x(n-p_{k1}) * sectio1_{power(q_{k1})} \ldots + \sum_{k=0}^{L} c_k x(n-k) + \sum_{k1=0}^{M} d_k x(n-p_{k1}) * section4\_power(q_{k1})$$ eq6

Equation 6 explicitly depicts the terms for section 1 and section 4. As shown in Table 1, if power does not exist in a section, then the respective multiplication of that section $\Sigma_{k1=0}^{M} b_k x(n-p_{k1}) * sectioN\_power(q_{k1})$ is also zero. The first embodiment, although simple and flexible, maintains a comparable accuracy to the theoretical vectorial method.

A second embodiment (second for labelling only, and not by way of limitation) can provide a simplification of the first embodiment when signal statistics are used as opposed to power splitting. Due to a peak to average ratio of the signal, the probability of the signal sample exceeding the highest threshold is small. In other words, the probability of the signal x(n) occupying all 4 sections is small. Almost all the time the signal x(n) occupies at least section 1. Most of the time, signal x(n) occupies either 2 or 3 sections.

Using the natural variability of the signal, the second embodiment can avoid both the signal and power splits. The natural variability of the signal can provide a higher weighting when the signal occupies all 4 sections since 4 copies of the vector and abs(Vector)$^2$ can be used for modelling.

FIG. 4 illustrates Table 2, showing vectorial sections according to certain embodiments. The example in Table 2 addresses a case in which the signal occupies three sections. Hence, x1(n), x2(n), and x3(n) are copies of the signal itself and corresponding abs(Vector)$^2$ of the signal is used as a multiplier to obtain the third order product for each of the sections. Eq7 provides a mathematical illustration of the second embodiment.

The second embodiment can achieve further reduction of multipliers over the first embodiment without sacrificing any accuracy. This can be achieved due to maintaining no signal or power split. Note the same term x(n−q)|×x(n−q)|$^2$ can be used 3 or 4 times depending on whether the signal is occupying 3 or 4 sections. Once the term is computed, additional multiplications are unnecessary. Thus, the example in Table 2 reduces the number of multipliers by a factor of 3.

$$y(n) = \sum_{k=0}^{L} a_k x(n-k) + \sum_{k1=0}^{M} b_k x(n-p_{k1}) * signal_{power(q_{k1})} \ldots +$$ eq7

$$\sum_{k=0}^{L} c_k x(n-k) + \sum_{k1=0}^{M} d_k x(n-p_{k1}) * signal\_power(q_{k1})$$

Figure 5:
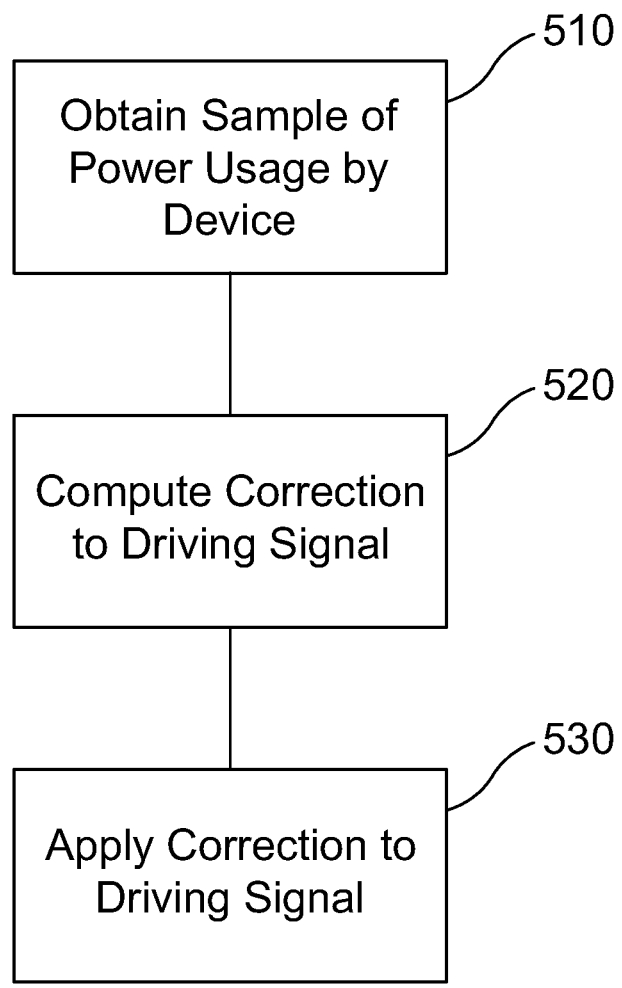
FIG. 5 illustrates a method according to certain embodiments.

FIG. 5 illustrates a method according to certain embodiments. As shown in FIG. 5, a method can include, at 510, obtaining a sample of a signal representative of power consumed by a device while the device is operating in a non-linear range while being driven according to a driving signal. The power usage can be the power of a particular component of the device, such as a power amplifier.

The method can also include, at 520, computing a correction to the driving signal based on the sample. The correction can be calculated based on a plurality of non-overlapped non-linear sections corresponding to a response of the device.

Computing the correction can avoid reliance on a vectorial split of the sampled signal. Nevertheless, computing the correction can rely on a power split among the non-overlapped non-linear sections, for example in the first embodiment described above. Alternatively, computing the correction may avoid reliance on a power split among the non-overlapped non-linear sections, for example in the second embodiment described above.

Computing the correction can include taking into account a power threshold for of the non-overlapped non-linear sections. Two non-limiting examples of such thresholds are illustrated in FIGS. 3 and 4.

Computing the correction can avoid computing a square root. Computing the correction can also avoid computing an arctan.

The method can further include, at 530, applying the correction to adjust the driving signal. The correction can be configured to adjust the power to a desired value of power.

Figure 6:
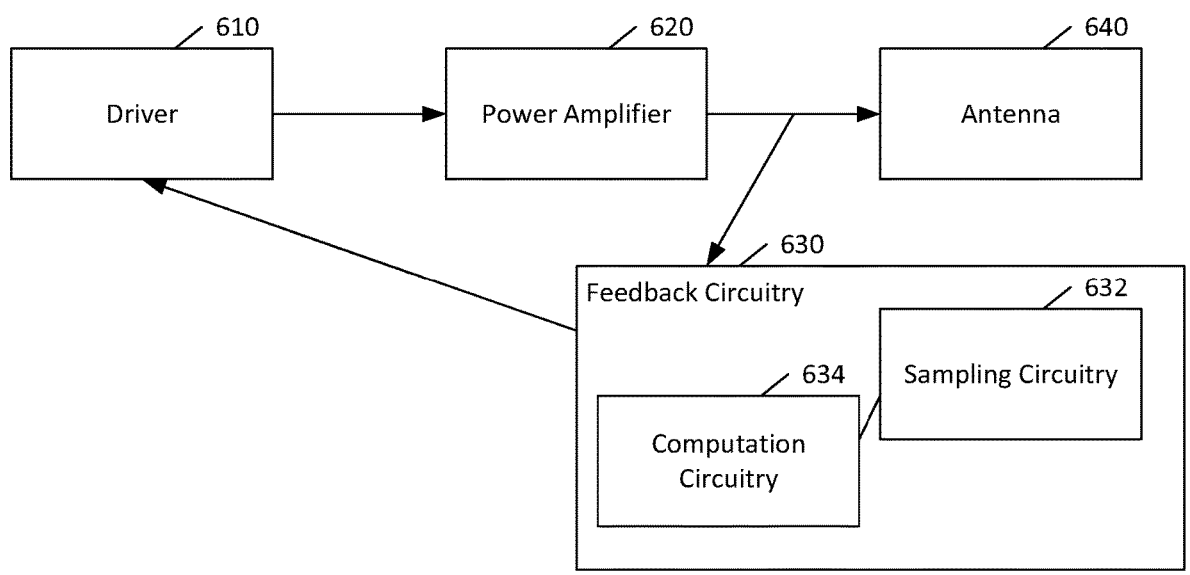
FIG. 6 illustrates an apparatus according to certain embodiments.

FIG. 6 illustrates an apparatus according to certain embodiments. As shown in FIG. 6, an apparatus can include a driver 610 that can supply a signal to a power amplifier 620 that in turn can send an amplified signal toward an antenna 640. The apparatus can also include feedback circuitry 630 that can sample the output of the power amplifier 620 using sampling circuitry 632 and provide an appropriate correction to the driver 610 or directly to the power amplifier 620 (this alternative not shown in FIG. 6). The correction can be calculated as described above using computation circuitry 634.

Figure 7:
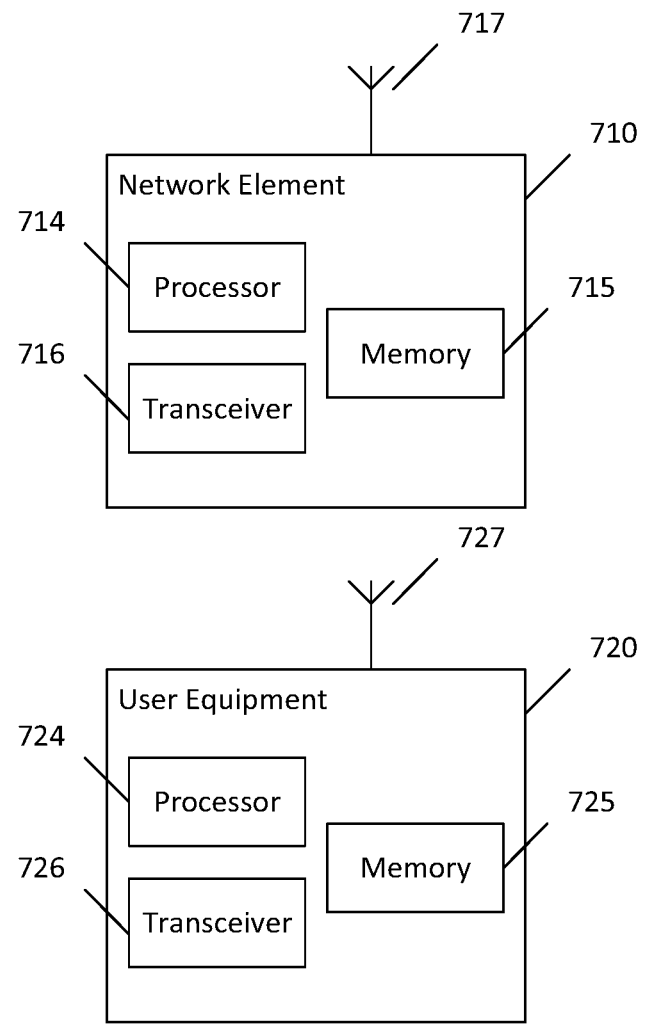
FIG. 7 illustrates a system according to certain embodiments.

FIG. 7 illustrates a system according to certain embodiments of the invention. It should be understood that each block of the flowchart of FIG. 5 may be implemented by various means or their combinations, such as hardware, software, firmware, one or more processors and/or circuitry (see, for example, FIG. 6). In one embodiment, a system may include several devices, such as, for example, network element 710 and user equipment (UE) or user device 720. The system may include more than one UE 720 and more than one network element 710, although only one of each is shown for the purposes of illustration. A network element can be an access point, a base station, an eNode B (eNB), or any other network element, such as a PCell base station or a PSCell base station. Each of these devices may include at least one processor or control unit or module, respectively indicated as 714 and 724. At least one memory may be provided in each device, and indicated as 715 and 725, respectively. The memory may include computer program instructions or computer code contained therein, for example for carrying out the embodiments described above.

One or more transceiver 716 and 726 may be provided, and each device may also include an antenna, respectively illustrated as 717 and 727. Although only one antenna each is shown, many antennas and multiple antenna elements may be provided to each of the devices. Other configurations of these devices, for example, may be provided. For example, network element 710 and UE 720 may be additionally configured for wired communication, in addition to wireless communication, and in such a case antennas 717 and 727 may illustrate any form of communication hardware, without being limited to merely an antenna.

Transceivers 716 and 726 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. It should also be appreciated that according to the "liquid" or flexible radio concept, the operations and functionalities may be performed in different entities, such as nodes, hosts or servers, in a flexible manner. In other words, division of labor may vary case by case. One possible use is to make a network element to deliver local content. One or more functionalities may also be implemented as a virtual application that is provided as software that can run on a server.

A user device or user equipment 720 may be a mobile station (MS) such as a mobile phone or smart phone or multimedia device, a computer, such as a tablet, provided with wireless communication capabilities, personal data or digital assistant (PDA) provided with wireless communication capabilities, vehicle, portable media player, digital camera, pocket video camera, navigation unit provided with wireless communication capabilities or any combinations thereof. The user device or user equipment 720 may be a sensor or smart meter, or other device that may usually be configured for a single location.

In an exemplifying embodiment, an apparatus, such as a node or user device, may include means for carrying out embodiments described above in relation to FIGS. 2 through 6.

Processors 714 and 724 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors. Additionally, the processors may be implemented as a pool of processors in a local configuration, in a cloud configuration, or in a combination thereof. The term circuitry may refer to one or more electric or electronic circuits. The term processor may refer to circuitry, such as logic circuitry, that responds to and processes instructions that drive a computer.

For firmware or software, the implementation may include modules or units of at least one chip set (e.g., procedures, functions, and so on). Memories 715 and 725 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network element 710 and/or UE 720, to perform any of the processes described above (see, for example, FIG. 5). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments of the invention may be performed entirely in hardware.

Furthermore, although FIG. 7 illustrates a system including a network element 710 and a UE 720, embodiments of the invention may be applicable to other configurations, and configurations involving additional elements, as illustrated and discussed herein. For example, multiple user equipment devices and multiple network elements may be present, or other nodes providing similar functionality, such as nodes that combine the functionality of a user equipment and an access point, such as a relay node.

Certain embodiments may have various benefits and/or advantages. For example, both the first embodiment and the second embodiment may provide a significant reduction of multiplier reduction over other non-linear modelling methods. Furthermore, both the first embodiment and the second embodiment can avoid computation of the square root or the arctan. The second embodiment can further simplify the modelling by making use of signal statistics. Both the first embodiment and the second embodiment can be implemented in hardware (HW), such as application specific integrated circuit (ASIC) or field programmable gate array (FPGA), with a minimum amount of gates.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

We claim:

1. A method, comprising:
    obtaining a sample of a signal representative of power consumed by a device while the device is operating in a non-linear range while being driven according to a driving signal;
    computing a correction to the driving signal based on the sample, wherein the correction is calculated based on a plurality of non-overlapped non-linear sections corresponding to a response of the device, wherein computing the correction relies on a power split among the non-overlapped non-linear sections according to a generalized memory polynomial model; and applying the correction to adjust the driving signal, wherein the correction is configured to adjust the power to a desired value of power.

2. The method of claim 1, wherein computing the correction does not rely on a vectorial split of the sampled signal.

3. The method of claim 1, wherein computing the correction does not rely on a power split among the non-overlapped non-linear sections.

4. The method of claim 1, wherein computing the correction comprises taking into account a power threshold for of the non-overlapped non-linear sections.

5. The method of claim 1, wherein computing the correction avoids computing a square root or computing the correction avoids computing an arctan.

6. An apparatus, comprising:
a least one processor; and
at least one memory including computer program code, wherein the at least one memory and the computer program code are configured to, with the at least one processor, cause the apparatus at least to
obtain a sample of a signal representative of power consumed by a device while the device is operating in a non-linear range while being driven according to a driving signal;
compute a correction to the driving signal based on the sample, wherein the correction is calculated based on a plurality of non-overlapped non-linear sections corresponding to a response of the device, wherein computation of the correction relies on a power split among the non-overlapped non-linear sections according to a generalized memory polynomial model; and
apply the correction to adjust the driving signal, wherein the correction is configured to adjust the power to a desired value of power.

7. The apparatus of claim 6, wherein computation of the correction does not rely on a vectorial split of the sampled signal.

8. The apparatus of claim 6, wherein computation of the correction does not rely on a power split among the non-overlapped non-linear sections.

9. The apparatus of claim 6, wherein computation of the correction comprises taking into account a power threshold for of the non-overlapped non-linear sections.

10. The apparatus of claim 6, wherein computation of the correction avoids computing a square root or computation of the correction avoids computing an arctan.

11. The apparatus of claim 6, wherein the apparatus comprises at least one of a mobile phone, user equipment, or mobile station.

12. An apparatus, comprising:
a sampling circuit configured to sample a signal representative of power consumed by a device while the device is operating in a non-linear range while being driven according to a driving signal; and
a computation circuit configured to compute a correction to the driving signal based on the sample, wherein the correction is calculated based on a plurality of non-overlapped non-linear sections corresponding to a response of the device, wherein computation of the correction relies on a power split among the non-overlapped non-linear sections according to a generalized memory polynomial model,
wherein the sampling circuit and the computation circuit are provided in feedback circuitry, the feedback circuitry being further configured to apply the correction to adjust the driving signal, wherein the correction is configured to adjust the power to a desired value of power.

13. The apparatus of claim 12, wherein computation of the correction does not rely on a vectorial split of the sampled signal.

14. The apparatus of claim 12, wherein computation of the correction does not rely on a power split among the non-overlapped non-linear sections.

15. The apparatus of claim 12, wherein computation of the correction comprises taking into account a power threshold for of the non-overlapped non-linear sections.

16. The apparatus of claim 12, wherein computation of the correction avoids computing a square root or computation of the correction avoids computing an arctan.

17. The apparatus of claim 12, wherein the apparatus comprises at least one of a mobile phone, user equipment, or mobile station.

* * * * *